United States Patent
Arita et al.

(10) Patent No.: US 10,059,798 B2
(45) Date of Patent: Aug. 28, 2018

(54) ACTIVE ESTER RESIN, EPOXY RESIN COMPOSITION, CURED PRODUCT THEREOF, PREPREG, CIRCUIT BOARD, AND BUILD-UP FILM

(71) Applicant: DIC Corporation, Tokyo (JP)

(72) Inventors: Kazuo Arita, Ichihara (JP); Tomohiro Shimono, Ichihara (JP)

(73) Assignee: DIC Corporation, Tokyo (JP)

( * ) Notice: Subject to any disclaimer, the term of this patent is extended or adjusted under 35 U.S.C. 154(b) by 563 days.

(21) Appl. No.: 14/436,202

(22) PCT Filed: Oct. 2, 2013

(86) PCT No.: PCT/JP2013/076807
§ 371 (c)(1),
(2) Date: Jul. 13, 2015

(87) PCT Pub. No.: WO2014/061450
PCT Pub. Date: Apr. 24, 2014

(65) Prior Publication Data
US 2015/0344617 A1    Dec. 3, 2015

(30) Foreign Application Priority Data

Oct. 17, 2012  (JP) ................................ 2012-229811

(51) Int. Cl.
| | |
|---|---|
| *C08G 63/137* | (2006.01) |
| *C08L 63/00* | (2006.01) |
| *C08G 63/00* | (2006.01) |
| *C09D 167/00* | (2006.01) |
| *C09D 163/00* | (2006.01) |
| *C09J 167/00* | (2006.01) |
| *C09J 163/00* | (2006.01) |
| *H05K 1/03* | (2006.01) |
| *C08J 5/24* | (2006.01) |
| *C08G 59/62* | (2006.01) |

(52) U.S. Cl.
CPC ............ *C08G 63/00* (2013.01); *C08G 59/62* (2013.01); *C08G 63/137* (2013.01); *C08J 5/24* (2013.01); *C08L 63/00* (2013.01); *C09D 163/00* (2013.01); *C09D 167/00* (2013.01); *C09J 163/00* (2013.01); *C09J 167/00* (2013.01); *H05K 1/0353* (2013.01); *C08J 2363/00* (2013.01); *C08J 2367/00* (2013.01); *C08J 2463/00* (2013.01); *C08J 2467/00* (2013.01); *Y10T 428/24917* (2015.01)

(58) Field of Classification Search
CPC ...... C08G 59/62; C08G 63/00; C08G 63/137; C08L 63/00
See application file for complete search history.

(56) References Cited

FOREIGN PATENT DOCUMENTS

| | | | |
|---|---|---|---|
| JP | 2009-235165 A | | 10/2009 |
| JP | 2012012534 | * | 1/2012 |

OTHER PUBLICATIONS

Arita et al., Machine translation of JP 2012-012534. Jan. 19, 2012.*
International Search Report dated Dec. 3, 2013, issued for PCT/JP2013/076807.

* cited by examiner

*Primary Examiner* — Ling Choi
*Assistant Examiner* — Gennadiy Mesh
(74) *Attorney, Agent, or Firm* — Locke Lord LLP

(57) ABSTRACT

An active ester resin
having a molecular structure represented by Structural Formula (1)

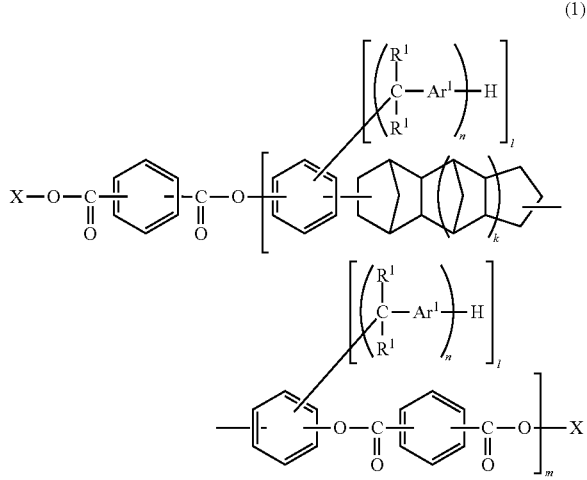

where X represents a benzene ring or a naphthalene ring, each $R^1$ independently represents a methyl group or a hydrogen atom, k is 0 or 1, n is 1 or 2, l is 1 or 2, and m is the average of a repeating unit and from 0.25 to 1.5. The active ester resin, as a curing agent, can be combined with an epoxy resin to form at least an epoxy resin composition, a cured product, a prepreg, a circuit board and a build-up film.

6 Claims, 3 Drawing Sheets

ACTIVE ESTER RESIN, EPOXY RESIN COMPOSITION, CURED PRODUCT THEREOF, PREPREG, CIRCUIT BOARD, AND BUILD-UP FILM

TECHNICAL FIELD

The present invention relates to an active ester resin which has a high solubility in a variety of solvents, which enables a cured product to have both a low dielectric constant and a low dielectric dissipation factor, and which also has a greatly low hygroscopicity. The present invention also relates to an epoxy resin composition in which the active ester resin is used as a curing agent, a cured product thereof, a prepreg, a circuit board, and a build-up film.

BACKGROUND ART

Epoxy resins and epoxy resin compositions essentially containing the epoxy resins as curing agents are widely used in electronic components of, for example, semiconductor devices and multilayer printed circuit boards because cured products thereof can have both excellent heat resistance and insulating properties. In particular, in the technical field of insulating materials for multilayer printed circuit boards in which such resins and compositions are used in electronic components, increases in the transmission speed and frequencies of signals in a variety of electronic devices have been recently promoted. Such increases in the transmission speed and frequencies of signals, however, have caused typical epoxy resin compositions and cured products thereof to have difficulty in terms of required properties of sufficiently low dielectric constant and dielectric dissipation factor. Hence, a thermosetting resin composition which enables production of a cured product having both a sufficiently low dielectric constant and dielectric dissipation factor also in faster transmission of signals with higher frequencies needs to be developed.

In a known technique for a material which enables both a low dielectric constant and a low dielectric dissipation factor, an active ester compound produced through esterification of a dicyclopentadiene phenol resin and α-naphthol with an isophthalic acid chloride is used as a curing agent for an epoxy resin (see Patent Literature 1). An epoxy resin composition in which the active ester compound disclosed in Patent Literature 1 is used enables decreases in both a dielectric constant and a dielectric dissipation factor as compared with epoxy resin compositions in which known phenol novolac active ester resins are used. Such an active ester compound can be, however, dissolved in limited types of organic solvents and therefore requires use of organic solvents with high environmental impact, such as toluene, for producing varnish, a prepreg, and a cured product. Thus, an epoxy resin curing agent which can give a low dielectric constant and a low dielectric dissipation factor and which can be dissolved also in organic solvents with low environmental impact, such as ester solvents and alcohol solvents, needs to be developed.

CITATION LIST

Patent Literature

PTL 1: Japanese Unexamined Patent Application Publication No. 2009-235165

SUMMARY OF INVENTION

Technical Problem

It is an object of the present invention to provide an active ester resin which has a high solubility in a variety of solvents, which enables a cured product to have both a low dielectric constant and a low dielectric dissipation factor, and which also has a greatly low hygroscopicity. It is another object of the present invention to provide an epoxy resin composition in which the active ester resin is used as a curing agent, a cured product thereof, a prepreg, a circuit board, and a build-up film.

Solution to Problem

The inventors have intensively conducted studies to achieve the above-mentioned objects and found the following to accomplish the present invention: an aromatic monohydroxy compound and a modified phenolic compound obtained by modifying part or the whole of the aromatic nucleus of a phenolic compound having an alicyclic hydrocarbon group with a phenylmethanol compound or a naphthylmethanol compound are esterified with an aromatic dicarboxylic acid or a halide thereof to produce an active ester resin; and such an active ester resin has a high solubility in solvents with low environmental impact, such as butanol and ethyl acetate, enables a cured product involving use of the same to have both a significantly low dielectric constant and dielectric dissipation factor, and also has a low hygroscopicity.

In particular, the present invention relates to an active ester resin including a structural moiety in which a structural unit (I) in which a plurality of arylene groups (a) are bonded to each other via an alicyclic hydrocarbon group is bonded to another structural unit (I) or an aryl group (d) via an arylene dicarbonyloxy group (c), wherein at least one of the arylene groups (a) in the resin has a structural part (b) represented by Structural Formula (i) and positioned on its aromatic nucleus.

[Chem. 1]

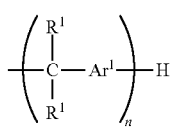

(i)

(in the formula, each $R^1$ independently represents a methyl group or a hydrogen atom; $Ar^1$ represents a phenylene group, a naphthylene group, or a phenylene group or naphthylene group which has one to three alkyl groups each having 1 to 4 carbon atoms on its aromatic nucleus; and n is 1 or 2).

The present invention also relates to a method for producing the active ester resin according to Claim 1, the method including allowing a phenolic compound (A) having a structure in which a plurality of aryl groups having phenolic hydroxyl groups are bonded to each other via an alicyclic hydrocarbon group to react with an aralkylating agent (B) to produce an aralkyl-modified phenolic compound (α) and then allowing the aralkyl-modified phenolic compound (α) to react with an aromatic dicarboxylic acid or aromatic dicarboxylic acid halide (C) and an aromatic monohydroxy compound (D) such that the phenolic hydroxyl groups of the aralkyl-modified phenolic compound (α) and the hydroxyl group of the aromatic monohydroxy compound (D) are in the ranges of 0.25 to 0.90 mol and 0.10 to 0.75 mol, respectively, relative to 1 mol of the total of the carboxyl groups or acid halide groups of the aromatic dicarboxylic acid or aromatic dicarboxylic acid halide (C).

The present invention also relates to an epoxy resin composition containing the active ester resin.

The present invention also relates to a cured product produced by curing the epoxy resin composition.

The present invention also relates to a prepreg produced by impregnating a reinforcing substrate with the epoxy resin composition which has been diluted with an organic solvent and semi-curing the impregnated reinforcing substrate.

The present invention also relates to a circuit board produced by preparing varnish through diluting the epoxy resin composition with an organic solvent, shaping the varnish into a plate, and thermally molding the shaped varnish together with copper foil under application of pressure.

The present invention also relates a build-up film produced by applying the epoxy resin composition which has been diluted with an organic solvent to a base film and drying the resulting film.

Advantageous Effects of Invention

The present invention can provide an active ester resin which has a high solubility in a variety of solvents, which enables a cured product to have both a low dielectric constant and a low dielectric dissipation factor, and which also has a greatly low hygroscopicity. The present invention can also provide an epoxy resin composition in which the active ester resin is used as a curing agent, a cured product thereof, a prepreg, a circuit board, and a build-up film.

DESCRIPTION OF EMBODIMENTS

Figure 1:
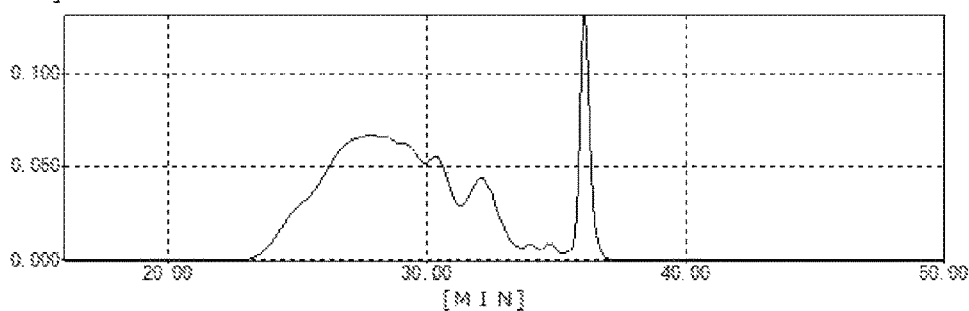
FIG. 1 is the GPC chart of an active ester resin (1) obtained in Example 1.

The present invention will now be described in detail.

The active ester resin of the present invention has a structural moiety in which a structural unit (I) in which a plurality of arylene groups (a) are bonded to each other via an alicyclic hydrocarbon group is bonded to another structural unit (I) or an aryl group (d) via an arylene dicarbonyloxy group (c), wherein at least one of the arylene groups (a) in the resin has a structural part (b) represented by Structural Formula (i) and positioned on its aromatic nucleus

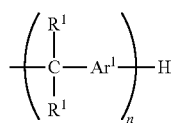

(i)

(where each $R^1$ independently represents a methyl group or a hydrogen atom; $Ar^1$ represents a phenylene group, a naphthylene group, or a phenylene group or naphthylene group which has one to three alkyl groups each having 1 to 4 carbon atoms on its aromatic nucleus; and n is 1 or 2).

In the active ester resin of the present invention, the arylene dicarbonyloxy group (c) is a so-called active ester group; an ester residue blocks a secondary hydroxyl group which generates in the curing reaction of an epoxy resin, so that the dielectric constant and dielectric dissipation factor of the cured product can be decreased.

In the active ester resin of the present invention, the structural part (b) represented by Structural Formula (i) further enhances the effect of decreases in a dielectric constant and a dielectric dissipation factor and contributes to the effect of an enhancement in the solubility in a variety of organic solvents as well because it is a relatively bulky substituent. In general, resins having a substituent with a sterically bulky structure have an excellent solubility in solvents whereas cured products thereof are likely to have a high hygroscopicity because they have a large free volume; however, the active ester resin of the present invention can have a significantly improved solubility in a variety of solvents as well as hygroscopicity kept at a low level.

The structural unit (I) in which multiple arylene groups (a) are bonded to each other via an alicyclic hydrocarbon group in the active ester resin of the present invention can be, for example, a structure obtained through the polyaddition reaction of an unsaturated alicyclic hydrocarbon compound having two double bonds per molecule with a phenolic compound.

Examples of the unsaturated alicyclic hydrocarbon compound having two double bonds per molecule include dicyclopentadiene, polymers of cyclopentadiene, tetrahydroindene, 4-vinylcyclohexene, 5-vinyl-2-norbornene, and limonene. These may be used alone or in combination. In particular, dicyclopentadiene is preferred because it enables production of a cured product having an excellent heat resistance and a low hygroscopicity. Dicyclopentadiene is contained in petroleum distillate, and thus industrial dicyclopentadiene contains polymers of cyclopentadiene and other aliphatic or aromatic diene compounds as impurities in some cases; in terms of properties such as heat resistance, curing properties, and formability, a product in which the purity of dicyclopentadiene is not less than 90 mass % is desirably employed.

Examples of the phenolic compound include phenol, cresol, xylenol, ethylphenol, isopropylphenol, butylphenol, octylphenol, nonylphenol, vinylphenol, isopropenylphenol, allylphenol, phenylphenol, benzylphenol, chlorophenol, bromophenol, 1-naphthol, 2-naphthol, 1,4-dihydroxynaphthalene, 2,3-dihydroxynaphthalene, 2,3-dihydroxynaphthalene, 2,6-dihydroxynaphthalene, and 2,7-dihydroxynaphthalene. These may be used alone or in combination. In particular, phenol is preferred because it enables production of an active ester resin which is highly curable and significantly resistant to moisture absorption.

The active ester resin of the present invention has a structural moiety in which the structural unit (I) is bonded to another structural unit (I) or the aryl group (d) via the arylene dicarbonyloxy group (c). Examples of the arylene dicarbonyloxy group (c) include a benzene-1,2-dicarbonyloxy group, a benzene-1,3-dicarbonyloxy group, a benzene-1,4-dicarbonyloxy group, a naphthalene-1,4-dicarbonyloxy group, a naphthalene-2,3-dicarbonyloxy group, a naphthalene-2,6-dicarbonyloxy group, a naphthalene-2,7-dicarbonyloxy group, and groups formed by substitution of the aromatic nuclei of these groups with, for instance, alkyl groups or alkoxy groups having 1 to 4 carbon atoms. Among these, a benzene-1,3-dicarbonyloxy group and a benzene-1,4-dicarbonyloxy group are preferred because they enable production of an active ester resin having excellent curing properties and are easy to produce, and the benzene-1,3-dicarbonyloxy group is more preferred.

Examples of the aryl group (d) include a phenyl group, an o-tolyl group, an m-tolyl group, a p-tolyl group, a 3,5-xylyl group, an o-biphenyl group, an m-biphenyl group, a p-biphenyl group, a 2-benzylphenyl group, a 4-benzylphenyl group, a 4-(α-cumyl)phenyl group, a 1-naphthyl group, and a 2-naphthyl group. Among these, a 1-naphthyl group and a 2-naphthyl group are preferred because they enable production of a cured product having an especially low dielectric constant and dielectric dissipation factor.

More specifically, the active ester resin of the present invention has a molecular structure having a repeating unit and the aryl groups (d) which are individually bonded to the ends thereof; in the repeating unit, the structural unit (I) is bonded to another structural unit (I) via the arylene dicarbonyloxy group (c). Such a molecular structure can be represented by General Formula (2).

[Chem. 2]

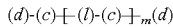

$$(d)\text{-}(c)\text{-}[(I)\text{-}(c)\text{-}]_m(d) \qquad (2)$$

As described above, the structural unit (I) has a structure in which the multiple arylene groups (a) are bonded to each other via an alicyclic hydrocarbon group, and at least one of the arylene groups (a) in the resin has the structural part (b) positioned on the aromatic nucleus thereof and represented by Structural Formula (i).

[Chem. 3]

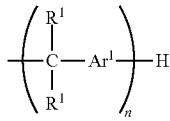

(i)

(in the formula, each $R^1$ independently represents a methyl group or a hydrogen atom; $Ar^1$ represents a phenylene group, a naphthylene group, or a phenylene group or naphthylene group which has one to three alkyl groups each having 1 to 4 carbon atoms on its aromatic nucleus; and n is 1 or 2).

In Structural Formula (i), $Ar^1$ represents a phenylene group, a naphthylene group, or a phenylene group or naphthylene group which has one to three alkyl groups each having 1 to 4 carbon atoms on its aromatic nucleus; in particular, a phenylene group is preferred because it enables production of an active ester resin which has a high solubility in a variety of solvents, which enables a cured product to have both a low dielectric constant and a low dielectric dissipation factor, and which also has a greatly low hygroscopicity. Each $R^1$ independently represents a methyl group or a hydrogen atom, and two $R^1$'s are each preferably a hydrogen atom because this enables production of a cured product which has a lower dielectric constant and a lower dielectric dissipation factor and which is highly resistant to moisture absorption.

In General Formula (2), m represents the average number of the repeating units; in order to produce an active ester resin having an excellent solubility in a variety of solvents, m is preferably in the range of 0.25 to 1.5, and more preferably 0.25 to 1.2.

The value of m in General Formula (2) which represents the active ester resin of the present invention can be determined as follows.

[Determination of m in General Formula (2)]

Ratios of theoretical molecular weights (β1, β2, β3, and β4) obtained by a GPC analysis under the following conditions in the cases of m=1, m=2, m=3, and m=4, respectively, to styrene-based molecular weights (α1, α2, α3, and α4) obtained in the case of m=1, m=2, m=3, and m=4, respectively, are determined (β1/α1, β2/α2, β3/α3, and β4/α4); and the average value of these ratios (β1/α1 to β4/α4) is obtained. The value obtained by multiplying this average value by a number average molecular weight (Mn) obtained in the GPC analysis is defined as the average molecular weight, and the value of m corresponding to this average molecular weight is calculated.

(Conditions for GPC Analysis)

Analysis Equipment: "HLC-8220 GPC" manufactured by TOSOH CORPORATION

Column: Guard Column "HXL-L" manufactured by TOSOH CORPORATION

"TSK-GEL G2000HXL" manufactured by TOSOH CORPORATION

"TSK-GEL G2000HXL" manufactured by TOSOH CORPORATION

"TSK-GEL G3000HXL" manufactured by TOSOH CORPORATION

"TSK-GEL G4000HXL" manufactured by TOSOH CORPORATION

Detector: RI (differential refractometry diameter)

Data processing: "GPC-8020 model II version 4.10" manufactured by TOSOH CORPORATION Analysis Conditions: Column Temperature 40° C.

Eluent tetrahydrofuran

Flow rate 1.0 ml/min

Standard sample: in accordance with the analysis manual of "GPC-8020 model II version 4.10", the following monodisperse polystyrenes having known molecular weights are used (Polystyrene Used)

"A-500" manufactured by TOSOH CORPORATION
"A-1000" manufactured by TOSOH CORPORATION
"A-2500" manufactured by TOSOH CORPORATION
"A-5000" manufactured by TOSOH CORPORATION
"F-1" manufactured by TOSOH CORPORATION
"F-2" manufactured by TOSOH CORPORATION
"F-4" manufactured by TOSOH CORPORATION
"F-10" manufactured by TOSOH CORPORATION
"F-20" manufactured by TOSOH CORPORATION
"F-40" manufactured by TOSOH CORPORATION
"F-80" manufactured by TOSOH CORPORATION
"F-128" manufactured by TOSOH CORPORATION Sample: 1.0 mass % tetrahydrofuran solution in terms of resin solid content is filtered through a microfilter (50 μl)

The active ester resin of the present invention can be produced, for instance, as follows. That is, a phenolic compound (A) having a structure in which multiple aryl groups having phenolic hydroxyl groups are bonded to each other via an alicyclic hydrocarbon group is allowed to react with an aralkylating agent (B) to produce an aralkyl-modified phenolic compound (α) (step 1), and then the aralkyl-modified phenolic compound (α) is allowed to react with an aromatic dicarboxylic acid or aromatic dicarboxylic acid halide (C) and an aromatic monohydroxy compound (D) such that the phenolic hydroxyl groups of the aralkyl-modified phenolic compound (α) and hydroxyl group of the aromatic monohydroxy compound (D) are in the ranges of 0.05 to 0.75 mol and 0.25 to 0.95 mol, respectively, relative to 1 mol of the total of the carboxyl groups or acid halide groups of the aromatic dicarboxylic acid or aromatic dicarboxylic acid halide (C) (step 2).

The phenolic compound (A) used in the step 1 and having a structure in which multiple aryl groups having phenolic hydroxyl groups are bonded to each other via an alicyclic hydrocarbon group can be, for example, a material obtained through the polyaddition reaction of an unsaturated alicyclic hydrocarbon compound having two double bonds per molecule with a phenolic compound.

Examples of the unsaturated alicyclic hydrocarbon compound having two double bonds per molecule include dicyclopentadiene, polymers of cyclopentadiene, tetrahydroindene, 4-vinylcyclohexene, 5-vinyl-2-norbonene, and limonene. These may be used alone or in combination. In particular, dicyclopentadiene is preferred because it enables production of a cured product having an excellent heat resistance and a low hygroscopicity. Dicyclopentadiene is contained in petroleum distillate, and thus industrial dicyclopentadiene contains polymers of cyclopentadiene and other aliphatic or aromatic diene compounds as impurities in some cases; in terms of properties such as heat resistance, curing properties, and formability, a product in which the purity of dicyclopentadiene is not less than 90 mass % is desirably employed.

Examples of the phenolic compound include phenol, cresol, xylenol, ethylphenol, isopropylphenol, butylphenol, octylphenol, nonylphenol, vinylphenol, isopropenylphenol, allylphenol, phenylphenol, benzylphenol, chlorophenol, bromophenol, 1-naphthol, 2-naphthol, 1,4-dihydroxynaphthalene, 2,3-dihydroxynaphthalene, 2,3-dihydroxynaphthalene, 2,6-dihydroxynaphthalene, and 2,7-dihydroxynaphthalene. These may be used alone or in combination. Among these, phenol is preferred because it enables production of an active ester resin which is highly curable and significantly resistant to moisture absorption.

Examples of the aralkylating agent (B) which is allowed to react with the phenolic compound (A) include phenylmethanol compounds, phenylmethyl halide compounds, naphthylmethanol compounds, naphthylmethyl halide compounds, and styrene compounds. Specific examples thereof include benzyl chloride, benzyl bromide, benzyl iodide, o-methylbenzyl chloride, m-methylbenzyl chloride, p-methylbenzyl chloride, p-ethylbenzyl chloride, p-isopropylbenzyl chloride, p-tert-butylbenzyl chloride, p-phenylbenzyl chloride, 5-chloromethyl acenaphthylene, 2-naphthylmethyl chloride, 1-chloromethyl-2-naphthalene, nuclear-substituted isomers thereof, α-methylbenzyl chloride, and α,α-dimethylbenzyl chloride; benzyl methyl ether, o-methylbenzyl methyl ether, m-methylbenzyl methyl ether, p-methylbenzyl methyl ether, p-ethylbenzyl methyl ether, nuclear-substituted isomers thereof, benzyl ethyl ether, benzyl propyl ether, benzyl isobutyl ether, benzyl n-butyl ether, p-methylbenzyl methyl ether, and nuclear-substituted isomers thereof; benzyl alcohol, o-methylbenzyl alcohol, m-methylbenzyl alcohol, p-methylbenzyl alcohol, p-ethylbenzyl alcohol, p-isopropylbenzyl alcohol, p-tert-butylbenzyl alcohol, p-phenylbenzyl alcohol, α-naphthyl methanol, nuclear-substituted isomers thereof, α-methylbenzyl alcohol, and α,α-dimethylbenzyl alcohol; and styrene, o-methylstyrene, m-methylstyrene, p-methylstyrene, α-methylstyrene, and β-methylstyrene.

Among these, benzyl chloride, benzyl bromide, and benzyl alcohol are preferred because they enable production of an active ester resin which has a high solubility in a variety of solvents, which enables a cured product to have both a low dielectric constant and a low dielectric dissipation factor, and which also has a greatly low hygroscopicity.

The step 1 can be, for instance, carried out in the presence of an acid catalyst at a temperature ranging from 100 to 180° C. Examples of the acid catalyst to be used include inorganic acids such as phosphoric acid, sulfuric acid, and hydrochloric acid; organic acids such as oxalic acid, benzenesulfonic acid, toluenesulfonic acid, methanesulfonic acid, and fluoromethanesulfonic acid; and Friedel-Crafts catalysts such as aluminum chloride, zinc chloride, stannic chloride, ferric chloride, and diethyl sulfate.

The amount of the acid catalyst to be used can be appropriately determined on the basis of, for instance, the intended degree of aralkylating. In the case where an inorganic acid or an organic acid is employed, the amount thereof is preferably in the range of 0.01 to 5.0 parts by mass relative to 100 parts by mass of a reaction raw material; in the case where a Friedel-Crafts catalyst is employed, the amount thereof is preferably in the range of 0.2 to 3.0 mol relative to 1 mol of the aralkylating agent (B).

The step 1 may be optionally performed in an organic solvent. Examples of the organic solvent to be used include ketone solvents such as acetone, methyl ethyl ketone, and cyclohexanone; acetic ester solvents such as ethyl acetate, butyl acetate, cellosolve acetate, propylene glycol monomethyl ether acetate, and carbitol acetate; carbitol solvents such as cellosolve and butyl carbitol; aromatic hydrocarbon solvents such as toluene and xylene; and dimethylformamide, dimethylacetamide, and N-methylpyrrolidone.

Since the step 2 is performed in the presence of a basic catalyst after the step 1 is completed, it is preferred that the reaction product obtained in the step 1 be neutralized and that the resulting product which is the aralkyl-modified phenolic compound (α) be then washed with water.

In the step 2, the aralkyl-modified phenolic compound (α) obtained as described above is allowed to react with the aromatic dicarboxylic acid or halide thereof (C) and the aromatic monohydroxy compound (D) to produce the intended active ester resin.

Examples of the aromatic dicarboxylic acid and halide thereof (C) used in the step 2 include isophthalic acid; terephthalic acid; naphthalene-1,4-dicarboxylic acid; naphthalene-2,3-dicarboxylic acid; naphthalene-2,6-dicarboxylic acid; naphthalene-2,7-dicarboxylic acid; acid fluoride, acid chloride, acid bromide, and acid iodide thereof; and substances formed by substitution with alkyl groups or alkoxy groups having 1 to 4 carbon atoms on the aromatic nuclei of these materials. Among these, dichloride of isophthalic acid and dichloride of terephthalic acid are preferred because they are particularly well reactive and enable production of an active ester having excellent curing properties, and dichloride of isophthalic acid is more preferred.

Examples of the aromatic monohydroxy compound (D) used in the step 2 include alkyl phenols such as phenol, o-cresol, m-cresol, p-cresol, and 3,5-xylenol; aralkyl phenols such as o-phenylphenol, p-phenylphenol, 2-benzylphenol, 4-benzylphenol, and 4-(α-cumyl) phenol; and naphthol compounds such as 1-naphthol and 2-naphthol. Among these, 1-naphthol and 2-naphthol are preferred because they enable production of a cured product having a particularly low dielectric constant and dielectric dissipation factor.

The step 2 can be, for example, performed in the presence of an alkaline catalyst at a temperature ranging from 40 to 65° C. Examples of usable alkaline catalysts include sodium hydroxide, potassium hydroxide, triethylamine, and pyridine. Among these, sodium hydroxide and potassium hydroxide are preferred because they have a high reaction efficiency. Furthermore, these catalysts can be in the form of a 3.0 to 30% aqueous solution.

The step 2 is preferably performed in an organic solvent because it contributes to easy control of the reaction. Examples of the organic solvent to be used include ketone solvents such as acetone, methyl ethyl ketone, and cyclohexanone; acetic ester solvents such as ethyl acetate, butyl acetate, cellosolve acetate, propylene glycol monomethyl ether acetate, and carbitol acetate; carbitol solvents such as cellosolve and butyl carbitol; aromatic hydrocarbon solvents such as toluene and xylene; and dimethylformamide, dimethylacetamide, and N-methylpyrrolidone.

As described above, in the step 2, each material is used such that the phenolic hydroxyl groups of the aralkyl-modified phenolic compound (α) and the hydroxyl group of the aromatic monohydroxy compound (D) are in the ranges of 0.25 to 0.90 mol and 0.10 to 0.75 mol, respectively, relative to 1 mol of the total of the carboxyl groups or acid halide groups of the aromatic dicarboxylic acid or aromatic dicarboxylic acid halide (C). Furthermore, each material is preferably used such that the phenolic hydroxyl groups of the aralkyl-modified phenolic compound (α) is in the range of 0.50 to 0.75 mol and that the hydroxyl group of the aromatic monohydroxy compound (D) is in the range of 0.25 to 0.50 mol, in order to produce an active ester resin which has an excellent solubility in a variety of solvents, which gives a higher effects of decreases in a dielectric constant and a dielectric dissipation factor, and which also has good curing properties.

After the step 2 is completed, in the case where an aqueous solution of an alkaline catalyst has been used, the reaction solution is left to stand for separation into layers to remove a water layer, the remaining organic layer is washed with water, and the washing with water is repeated until the water layer becomes substantially neutral, thereby producing the intended active ester resin.

Such an active ester resin has a high solubility in a variety of organic solvents and an excellent flame retardancy as well; hence, the softening point thereof is preferably in the range of 60 to 170° C.

Assuming that the number of functional groups in the active ester resin of the present invention is the total of the aryl carbonyloxy groups and phenolic hydroxyl groups which are present in the resin structure, the functional group equivalent weight of the active ester resin is preferably in the range of 240 to 400 g/eq., and more preferably 300 to 370 g/eq., in order to give good curing properties and to produce a cured product having a low dielectric constant and a low dielectric dissipation factor.

The active ester resin of the present invention can have various molecular structures on the basis of the structure of each reaction material which is to be arbitrarily selected; in particular, the molecular structure represented by General Formula (1) is preferred because it gives a high solubility in a variety of solvents, enables a cured product to have both a low dielectric constant and a low dielectric dissipation factor, and also gives a greatly low hygroscopicity.

[Chem. 4]

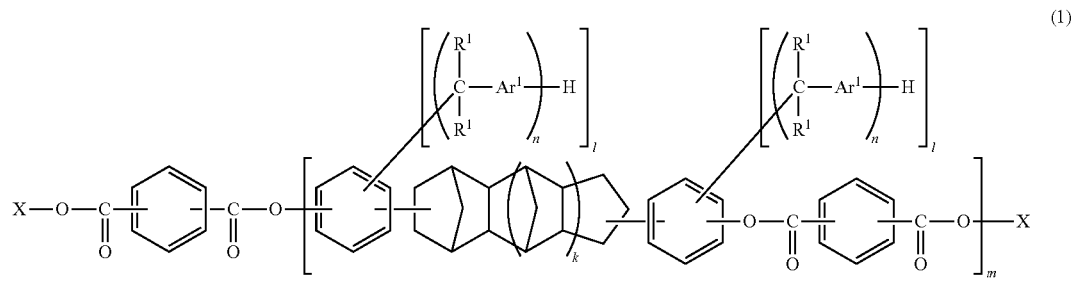

(in the formula, X represents a benzene ring or a naphthalene ring, k is 0 or 1, n is 1 or 2, l is 1 or 2, and m is the average of a repeating unit and from 0.25 to 1.5) A molecular structure represented by General Formula (1) in which m ranges from 0.25 to 1.2 is more preferred.

In General Formula (1), the value of m which is the average of the repeating unit can be determined as in the determination of m in General Formula (2).

The epoxy resin composition of the present invention contains the above-mentioned active ester resin and an epoxy resin as essential components.

Examples of the epoxy resin used in the present invention include bisphenol A-type epoxy resins, bisphenol F-type epoxy resins, biphenyl-type epoxy resins, tetramethylbiphenyl-type epoxy resins, polyhydroxynaphthalene-type epoxy resins, phenol novolac-type epoxy resins, cresol novolac-type epoxy resins, triphenylmethane-type epoxy resins, tetraphenylethane-type epoxy resins, dicyclopentadiene-phenol addition-reaction-type epoxy resins, phenol aralkyl-type epoxy resins, naphthol novolac-type epoxy resins, naphthol aralkyl-type epoxy resins, naphthol-phenol co-condensed novolac-type epoxy resins, naphthol-cresol co-condensed novolac-type epoxy resins, aromatic hydrocarbon formaldehyde resin-modified phenol resin-type epoxy resins, and biphenyl-modified novolac-type epoxy resins. Among these epoxy resins, tetramethylbiphenol-type epoxy resins, biphenylaralkyl-type epoxy resins, polyhydroxynaphthalene-type epoxy resins, and novolac-type epoxy resins are preferred in terms of production of a cured product particularly having a high flame retardancy; dicyclopentadiene-phenol-addition-reaction-type epoxy resins are preferred in terms of production of a cured product having excellent dielectric properties.

In the epoxy resin composition of the present invention, the amounts of the active ester resin and epoxy resin are preferably determined such that the epoxy groups of the epoxy resin are from 0.8 to 1.2 equivalents relative to 1 equivalent of the total of the active groups which are present in the active ester resin, which enables good curing properties and production of a cured product having a low dielectric constant and a low dielectric dissipation factor. In this case, the term "the active groups which are present in the active ester resin" refers to aryl carbonyloxy groups and phenolic hydroxyl groups which are present in the resin structure.

In the epoxy resin composition of the present invention, the active ester resin can be used in combination with another curing agent. Examples of such a curing agent to be used include amine compounds such as diaminodiphenylmethane, diethylenetriamine, triethylenetetramine, diaminodiphenylsulfone, isophoronediamine, imidazole, BF$_3$-amine complexes, and guanidine derivatives; amide compounds such as dicyandiamide and polyamide resin synthesized from a linolenic acid dimer and ethylenediamine; acid anhydrides such as phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride; and polyhydric phenol compounds such as phenol novolac resins, cresol novolac resins, aromatic hydrocarbon formaldehyde resin-modified phenol resins, dicyclopentadiene phenol addition-type resins, phenol aralkyl resins, naphthol aralkyl resins, trimethylolmethane resins, tetraphenylolethane resins, naphthol novolac resins, naphthol-phenol co-condensed novolac resins, naphthol-cresol co-condensed novolac resins, biphenyl-modified phenol resins (polyhydric phenol compounds having phenol nuclei connected through bismethylene groups), biphenyl-modified naphthol resins (polyhydric naphthol compounds having phenol nuclei connected through bismethylene groups), and aminotriazine-modified phenol resins (polyhydric phenol compounds having phenol nuclei connected through melamine or benzoguanamine).

Among these, materials each having many aromatic skeletons in its molecular structure are preferred because they have good dielectric properties and are highly resistant to moisture absorption. Specifically, phenol novolac resins, cresol novolac resins, aromatic hydrocarbon formaldehyde resin-modified phenol resins, phenol aralkyl resins, naphthol aralkyl resins, naphthol novolac resins, naphthol-phenol co-condensed novolac resins, naphthol-cresol co-condensed novolac resins, biphenyl-modified phenol resins, biphenyl-modified naphthol resins, and aminotriazine-modified phenol resins are preferred.

In the case where such another curing agent is used as well, the amount thereof is preferably in the range of 10 to 50 parts by mass relative to 100 parts by mass of the total of the active ester resin and the curing agent.

The epoxy resin composition of the present invention may optionally contain a curing accelerator. Examples of the curing accelerator to be used include phosphorus compounds, tertiary amines, imidazole, metal salts of organic acids, Lewis acid, and amine complex salts. In particular, in the case where the epoxy resin composition of the present invention is used for a build-up material or a circuit board, dimethylaminopyridine and imidazole are preferred because they have an excellent heat resistance, dielectric properties, solder resistance, and another property.

The active ester resin of the present invention has an excellent solubility in solvents as descried above; in the case where the epoxy resin composition of the present invention is used for a build-up material and a circuit board, alcohol solvents and ester solvents can be used in place of solvents which have been traditionally used, such as toluene, in order to make the epoxy resin composition be in the form of varnish. Examples of an organic solvent usable as the solvent in the epoxy resin composition of the present invention include aromatic hydrocarbon solvents which have been typically used, such as toluene and xylene; ketone solvents such as acetone, methyl ethyl ketone, and cyclohexanone; acetic ester solvents such as ethyl acetate, butyl acetate, cellosolve acetate, propylene glycol monomethyl ether acetate, and carbitol acetate; alcohol solvents such as ethanol, propanol, and butanol; carbitol solvents such as cellosolve and butyl carbitol; and dimethylformamide, dimethylacetamide, and N-methylpyrrolidone.

In the case where the epoxy resin composition of the present invention is used in a printed wiring board, the solvent is preferably a polar solvent having a boiling point of not more than 160° C., such as methyl ethyl ketone, acetone, or 1-methoxy-2-propanol, and preferably used such that the nonvolatile content ranges from 40 to 80 mass %. In the case where the epoxy resin composition of the present invention is used in a build-up adhesive film, ketone solvents such as acetone, methyl ethyl ketone, and cyclohexanone; acetic ester solvents such as ethyl acetate, butyl acetate, cellosolve acetate, propylene glycol monomethyl ether acetate, and carbitol acetate; alcohol solvents such as ethanol, propanol, and butanol; carbitol solvents such as cellosolve and butyl carbitol; and dimethylformamide, dimethylacetamide, and N-methylpyrrolidone are preferably employed; and they are preferably used such that the nonvolatile content ranges from 30 to 60 mass %.

The epoxy resin composition of the present invention may optionally contain another thermosetting resin where appropriate. Examples of a usable thermosetting resin include cyanate ester compounds, vinylbenzyl compounds, acrylic compounds, maleimide compounds, and copolymers of styrene and maleic anhydride. In the case where such a thermosetting resin is additionally used, the amount thereof is not particularly limited provided that the effect of the present invention is not impaired; the amount is preferably in the range of 1 to 50 parts by mass relative to 100 parts by mass of the epoxy resin composition.

In the case where the active ester resin of the present invention is used in an application in which high flame retardancy is needed, e.g., printed wiring boards, a non-halogen flame retardant which is substantially free from halogen atoms may be used.

Examples of the non-halogen flame retardant include phosphorus flame retardants, nitrogen flame retardants, silicone flame retardants, inorganic flame retardants, and flame retardants of organic metal salts. These can be used without any limitation; in addition, they can be used alone, the same type of multiple flame retardants can be used, or different types of flame retardants can be used in combination.

The phosphorus flame retardant may be either inorganic or organic. Examples of an inorganic compound include red phosphorus and inorganic nitrogen-containing phosphorus compounds such as ammonium phosphates (e.g., monoammonium phosphate, diammonium phosphate, triammonium phosphate, and ammonium polyphosphate) and phosphoric acid amide.

The red phosphorus is preferably surface-treated for the purpose of, for instance, preventing hydrolysis. Examples of such a surface treatment include (i) techniques which involve applying an inorganic compound such as magnesium hydroxide, aluminum hydroxide, zinc hydroxide, titanium hydroxide, bismuth oxide, bismuth hydroxide, bismuth nitrate, or a mixture of the foregoing; (ii) techniques which involve applying a mixture of an inorganic compound, such as magnesium hydroxide, aluminum hydroxide, zinc hydroxide, or titanium hydroxide, and a thermosetting resin such as a phenolic resin; and (iii) techniques which involve applying a thermosetting resin such as a phenolic resin to a coating of an inorganic compound such as magnesium hydroxide, aluminum hydroxide, zinc hydroxide, or titanium hydroxide to provide double coatings.

Examples of the organic phosphorus compounds include general organic phosphorus compounds such as phosphoric ester compounds, phosphonic acid compounds, phosphinic acid compounds, phosphine oxide compounds, phosphorane compounds, and organic nitrogen-containing phosphorus compounds; cyclic organic phosphorus compounds such as 9,10-dihydro-9-oxa-10-phosphaphenanthrene-10-oxide, 10-(2,5-dihydroxyphenyl)-10H-9-oxa-10-phosphaphenanthrene-10-oxide, and 10-(2,7-dihydroxynaphthyl)-10H-9-oxa-10-phosphaphenanthrene-10-oxide; and derivatives obtained by reactions of such cyclic organic phosphorus compounds with compounds such as epoxy resins and phenolic resins.

For example, in the case where red phosphorus is used, the amount of the phosphorus flame retardant is preferably in the range of 0.1 to 2.0 parts by mass relative to 100 pats by mass of the epoxy resin composition; in the case where an organic phosphorus compound is used, the amount of the phosphorus flame retardant is preferably in the range of 0.1 to 10.0 parts by mass, and more preferably 0.5 to 6.0 parts by mass relative thereto.

When the phosphorus flame retardant is used, the phosphorus flame retardant may be used in combination with hydrotalcite, magnesium hydroxide, boride compounds, zirconium oxide, black dyes, calcium carbonate, zeolite, zinc molybdate, or activated carbon.

Examples of the nitrogen flame retardants include triazine compounds, cyanuric acid compounds, isocyanuric acid compounds, and phenothiazine; of these, triazine compounds, cyanuric acid compounds, and isocyanuric acid compounds are preferred.

Examples of the triazine compounds include melamine, acetoguanamine, benzoguanamine, melon, melam, succinoguanamine, ethylenedimelamine, melamine polyphosphate, and triguanamine; aminotriazine sulfate compounds such as guanylmelamine sulfate, melem sulfate, and melam sulfate; the above-mentioned aminotriazine-modified phonolic resins; and compounds obtained by further modifying aminotriazine-modified phonolic resins with, for instance, tung oil or isomerized linseed oil.

Examples of the cyanuric acid compounds include cyanuric acid and melamine cyanurate.

The amount of the nitrogen flame retardant is, for example, preferably in the range of 0.05 to 10 parts by mass, and more preferably 0.1 to 5 parts by mass relative to 100 parts by mass of the epoxy resin composition.

Such a nitrogen flame retardant may be used in combination with, for example, a metal hydroxide or a molybdenum compound.

Any silicone flame retardant can be used provided that the silicone flame retardant is an organic compound having silicon atoms. Examples of the silicone flame retardant include silicone oils, silicone rubbers, and silicone resins.

The amount of the silicone flame retardant is, for example, preferably in the range of 0.05 to 20 parts by mass relative to 100 parts by mass of the epoxy resin composition. In the case where the silicone flame retardant is used, molybdenum compounds, alumina, or another material may be used in combination.

Examples of the inorganic flame retardant include metal hydroxides, metal oxides, metal carbonate compounds, metal powder, boron compounds, and low-melting-point glass.

Examples of the metal hydroxides include aluminum hydroxide, magnesium hydroxide, dolomite, hydrotalcite, calcium hydroxide, barium hydroxide, and zirconium hydroxide.

Examples of the metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Examples of the metal carbonate compounds include zinc carbonate, magnesium carbonate, calcium carbonate, barium carbonate, basic magnesium carbonate, aluminum carbonate, iron carbonate, cobalt carbonate, and titanium carbonate.

Examples of the metal powder include powder made of aluminum, iron, titanium, manganese, zinc, molybdenum, cobalt, bismuth, chromium, nickel, copper, tungsten, or tin.

Examples of the boron compounds include zinc borate, zinc metaborate, barium metaborate, boric acid, and borax.

Examples of the low-melting-point glass include CEEPREE (Bokusui Brown Co., Ltd.), hydrated glass $SiO_2$—$MgO$—$H_2O$, and glass compounds of $PbO$—$B_2O_3$, $ZnO$—$P_2O_5$—$MgO$, $P_2O_5$—$B_2O_3$—$PbO$—$MgO$, $P$—$Sn$—$O$—$F$, $PbO$—$V_2O_5$—$TeO_2$, $Al_2O_3$—$H_2O$, and lead borosilicate.

The amount of the inorganic flame retardant is, for instance, preferably in the range of 0.05 to 20 parts by mass, and more preferably 0.5 to 15 parts by mass relative to 100 parts by mass of the epoxy resin composition.

Examples of the flame retardants of organic metal salts include ferrocene, acetylacetonato metal complexes, organic metal carbonyl compounds, organic cobalt salt compounds, organic metal sulfonate salts, and compounds in which metal atoms and aromatic compounds or heterocyclic compounds are bonded through ionic bonds or coordinate bonds.

The amount of the flame retardant of an organic metal salt is, for instance, preferably in the range of 0.005 to 10 parts by mass relative to 100 parts by mass of the epoxy resin composition.

The epoxy resin composition of the present invention can optionally contain an inorganic filler. Examples of the inorganic filler include fused silica, crystalline silica, alumina, silicon nitride, and aluminium hydroxide. In the case where the inorganic filler content is adjusted to be particularly large, fused silica is preferably employed. The fused silica may be in the form of fragments or spheres; in order to enhance the amount of the fused silica and to suppress an increase in the melt viscosity of a shaped material, it is preferred that spherical fused silica be mainly used. Furthermore, in order to enhance the amount of the spherical silica, it is preferred that the particle size distribution of the spherical silica be appropriately adjusted. The filing rate thereof is preferably high in view of flame retardancy and particularly preferably not less than 20 mass % relative to the total amount of the thermosetting resin compositions. In an application to conductive paste, conductive fillers such as silver powder and copper powder can be used.

The epoxy resin composition of the present invention can optionally also contain a variety of compounding ingredients such as silane coupling agents, mold releasing agents, pigments, and emulsifiers.

The epoxy resin composition of the present invention can be produced by uniformly mixing the above-mentioned components with each other and can be easily formed into a cured product by known techniques for curing epoxy resin compositions. Examples of such a cured product include shaped cured products such as laminates, castings, adhesive layers, coating films, and films.

The epoxy resin composition of the present invention can be suitably used as a material of rigid printed wiring boards;

a resin composition for flexible wiring boards; an insulating material for circuit boards, such as an interlayer insulating material for build-up substrates; and a variety of electronic materials such as a semiconductor sealing material, conductive paste, a build-up adhesive film, a resin casting material, and an adhesives because a cured product of the epoxy resin composition has both a low dielectric constant and a low dielectric dissipation factor. In particular, the high solubility of the active ester resin of the present invention in a variety of organic solvents enables the epoxy resin composition to be especially preferably used as a material of circuit boards, such as a material of rigid printed wiring boards, a resin composition for flexible wiring boards, and an interlayer insulating material for build-up substrates.

In application to circuit boards, the epoxy resin composition of the present invention is diluted with an organic solvent in order to obtain varnish, this varnish is formed into a plate and then bonded to copper foil, and then the resulting product is heated and compressed to be shaped, thereby being able to produce circuit boards. In application to rigid printed wiring boards, a supporting base is impregnated with a varnish-like epoxy resin composition containing an organic solvent, the epoxy resin is semi-cured in order to obtain a prepreg, and copper foil is placed on the prepreg and thermally attached thereto under application of pressure, thereby being able to produce rigid printed wiring boards. Examples of the supporting base which can be used include paper, a glass fabric, a nonwoven glass fabric, aramid paper, an aramid fabric, a glass fiber mat, and a glass roving fabric. Further specifically describing such a process, the above-mentioned epoxy resin composition in the form of varnish is heated at a temperature suitable for the type of a solvent used, preferably from 50 to 170° C., to produce a prepreg that is a cured product. In this case, the mass ratio of the thermosetting resin composition to be used to the supporting base is not particularly limited; in general, it is preferred that the resin content in the prepreg be adjusted to be from 20 to 60 mass %. Then, the prepreg produced in this manner is laminated in accordance with routine procedures, and copper foil is appropriately put thereon. The prepreg and the copper foil are thermally bonded to each other under application of pressure from 1 to 10 MPa at 170 to 250° C. for 10 minutes to 3 hours, thereby being able to produce the intended circuit board.

In the case where the epoxy resin composition of the present invention is used to produce a flexible wiring board, the epoxy resin composition to which an organic solvent has been added is applied to an electrically insulating film with an applicator such as a reverse roll coater or a comma coater. Then, the resulting product is heated with a heater at 60 to 170° C. for 1 to 15 minutes in order to volatilize the solvent, thereby turning the epoxy resin composition into a B stage. Then, the resin composition layer is thermally bonded to metal foil under application of pressure with, for example, a heating roller. In this step, the pressure is preferably in the range of 2 to 200 N/cm, and the temperature is preferably in the range of 40 to 200° C. If these steps are enough to produce sufficient adhesiveness, the process can be completed at this point; if complete curing is needed, the product is preferably further subjected to post-curing at 100 to 200° C. for 1 to 24 hours. The thickness of the final cured resin composition layer is preferably in the range of 5 to 100 μm.

In the case where the epoxy resin composition of the present invention is used to produce an interlayer insulating material for a build-up substrate, for instance, the epoxy resin composition to which rubber, a filler, or another material has been appropriately added is applied to a wiring circuit board having a circuit by spray coating or curtain coating and then cured. Then, predetermined holes, such as through-holes, are optionally formed therein; and the resulting product is treated with a roughening agent. The surface thereof is washed with hot water to be roughened and then subjected to metal plating such as copper plating. The plating technique is preferably electroless plating or electroplating; and examples of the roughening agent include an oxidizing agent, an alkali, and an organic solvent. These steps are properly repeated in sequence to alternately form an insulating resin layer and a conductive layer having a predetermined circuit pattern in a build-up structure, thereby being able to produce a build-up substrate. In this case, the through-holes are formed after formation of the outermost insulating resin layer. Meanwhile, the resin composition is semi-cured on copper foil, and the copper foil with the resin is thermally bonded onto a wiring circuit board having a circuit at 170 to 250° C. under application of pressure to form a rough surface, thereby being able to produce a build-up substrate without the plating step.

An example of a technique for producing a build-up adhesive film of the epoxy resin composition of the present invention is a technique in which a resin composition layer is formed by applying the epoxy resin composition of the present invention onto a supporting film to produce an adhesive film for multilayer printed wiring boards.

In the case where the epoxy resin composition of the present invention is used to produce a build-up adhesive film, it is important that the adhesive film is softened under temperature conditions for lamination in vacuum lamination process (in general, from 70° C. to 140° C.) and has a fluidity (resin fluidity) which enables via holes or through-holes that are present in a circuit board to be filled with resin at the same time as lamination to the circuit board; hence, it is preferred that the above-mentioned components be mixed with each other so as to give such properties.

In general, the through-holes of a multilayer printed wiring board each have a diameter from 0.1 to 0.5 mm and a depth from 0.1 to 1.2 mm, and it is preferred that the through-holes can be normally filled with the resin within these ranges. In the case where the lamination is performed on the both sides of a circuit board, it is desirable that the through-holes be filled in approximately half the depth thereof.

In particular, the above-mentioned adhesive film can be produced as follows; the epoxy resin composition of the present invention in the form of varnish is prepared, this varnish-like composition is subsequently applied to the surface of a supporting film, and the organic solvent is dried by heating or hot blast, thereby forming an epoxy resin composition layer ($\alpha$).

The layer ($\alpha$) is generally formed so as to have a thickness greater than or equal to the thickness of the conductive layer. Since the thickness of the conductive layer of a circuit board is normally in the range of 5 to 70 μm, the resin composition layer preferably has a thickness ranging from 10 to 100 μm.

The layer ($\alpha$) may be protected by a protective film which will be described later. Protection by the protective film can prevent adhesion of, for example, dust to the surface of the resin composition layer and damage thereof.

The above-described supporting film and protective film may be composed of, for example, a polyolefin such as polyethylene, polypropylene, or polyvinyl chloride; a polyester such as polyethylene terephthalate (hereafter referred to as "PET" in some cases) or polyethylene naphthalate; polycarbonate; polyimide; release paper; or metal foil such as copper foil or aluminum foil. The supporting film and the protective film may be subjected to a mat treatment, a corona treatment, or a release treatment.

The thickness of the supporting film is not particularly limited and generally in the range of 10 to 150 µm, preferably 25 to 50 µm. The protective film preferably has a thickness of 1 to 40 µm.

The above-mentioned supporting film is released after lamination to a circuit board or after formation of an insulating layer by thermal curing. Releasing the supporting film after the thermal curing of the adhesive film enables adhesion of, for example, dust to be prevented in the curing step. In the case where the supporting film is released after the curing, the supporting film is generally subjected to a release treatment in advance.

Such an adhesive film can be used to produce a multilayer printed wiring board, for example, as follows; in the case where the layer (α) is protected by a protective film, the protective film is removed, and then lamination is performed by, for instance, vacuum lamination such that the layer (α) is in direct contact with one or both of the surfaces of a circuit board. The lamination may be performed by a batch process or a continuous process with rollers. The adhesive film and the circuit board may be optionally heated (preheated) before the lamination.

The lamination is preferably performed under the following lamination conditions: a press-bonding temperature (lamination temperature) of 70 to 140° C., a pressure-bonding pressure of 1 to 11 kgf/cm$^2$ (9.8×10$^4$ to 107.9×10$^4$ N/m2), and a reduced air pressure of not more than 20 mmHg (26.7 hPa).

In the case where the epoxy resin composition of the present invention is used as conductive paste, for instance, conductive fine particles are dispersed in the epoxy resin composition to produce a composition used for an anisotropic conductive film, or the epoxy resin composition is formed into a paste resin composition used for circuit connection or anisotropic conductive adhesive which are each in the form of liquid at room temperature.

The epoxy resin composition of the present invention can be used as a resist ink. In this case, for instance, a vinyl monomer containing an ethylenically unsaturated double bond and a cationic polymerization catalyst as a curing agent are added to the epoxy resin composition; a pigment, talc, and a filler are added thereto to produce a composition used for a resist ink; and this composition is applied onto a printed circuit board by screen printing and then turned into a cured resist ink.

Since the active ester resin of the present invention has higher solubility in solvents than existing active ester resins as described above, it can be easily in the form of varnish when it is used for a variety of electronic materials; in addition, more environment-friendly organic solvents, such as ester solvents and alcohol solvents, can be used in place of solvents which have a high environmental load and which have been traditionally commonly used, such as toluene. Furthermore, the cured product of the epoxy resin composition of the present invention has both a low dielectric constant and a low dielectric dissipation factor and can therefore contribute to an enhancement in the operation speed of high-frequency devices.

EXAMPLES

The present invention will now be specifically described with reference to Examples and Comparative Examples, and the terms "part" and "%" are hereinafter on a mass basis unless otherwise specified. Measurement of melt viscosity and a softening point and analyses by GPC, $^{13}$C-NMR, and an MALDI-MS spectrum were performed under the following conditions.

1) Melt Viscosity at 180° C.: The measurement was based on ASTM D4287.

2) Measurement of Softening Point: The measurement was based on JIS K7234.

3) GPC: The analysis was carried out under the following conditions.

Measurement Equipment: "HLC-8220 GPC" manufactured by TOSOH CORPORATION

Column: Guard Column "HXL-L" manufactured by TOSOH CORPORATION

"TSK-GEL G2000HXL" manufactured by TOSOH CORPORATION

"TSK-GEL G2000HXL" manufactured by TOSOH CORPORATION

"TSK-GEL G3000HXL" manufactured by TOSOH CORPORATION

"TSK-GEL G4000HXL" manufactured by TOSOH CORPORATION

Detector: RI (differential refractometry diameter)

Data processing: "GPC-8020 model II version 4.10" manufactured by TOSOH CORPORATION Measurement Conditions: Column Temperature 40° C.

Eluent tetrahydrofuran

Flow rate 1.0 ml/min

Standard sample: in accordance with the analysis manual of "GPC-8020 model II version 4.10", the following monodisperse polystyrenes having known molecular weights were used.

(Polystyrene Used)

"A-500" manufactured by TOSOH CORPORATION

"A-1000" manufactured by TOSOH CORPORATION

"A-2500" manufactured by TOSOH CORPORATION

"A-5000" manufactured by TOSOH CORPORATION

"F-1" manufactured by TOSOH CORPORATION

"F-2" manufactured by TOSOH CORPORATION

"F-4" manufactured by TOSOH CORPORATION

"F-10" manufactured by TOSOH CORPORATION

"F-20" manufactured by TOSOH CORPORATION

"F-40" manufactured by TOSOH CORPORATION

"F-80" manufactured by TOSOH CORPORATION

"F-128" manufactured by TOSOH CORPORATION

Sample: 1.0 mass % tetrahydrofuran solution in terms of resin solid content was filtered through a microfilter (50 µl).

4) $^{13}$C-NMR: The measurement was carried out with "JNM-ECA500" manufactured by JEOL Ltd.

5) MALDI-MS: The measurement was carried out with "AXIMA-TOF2" manufactured by Shimadzu Biotech.

Example 1 Production of Active Ester Resin (1)

Into a flask equipped with a thermometer, a dropping funnel, a cooling pipe, a fractionating column, and a stirrer, 330 g (1.0 mol) of a dicyclopentadiene phenol resin, 216 g (2.0 mol) of benzyl alcohol, and 5 g of a p-toluenesulfonic acid monohydrate were put. The content was stirred at room temperature while nitrogen was blown. Then, the temperature was increased to 150° C., and stirring was carried out for 6 hours while generated water was distilled off to the outside of the system. After the termination of the reaction, 500 g of methyl isobutyl ketone and 5.8 g of a 20% sodium hydroxide aqueous solution were added thereto for neutralization, the water layer was subsequently removed by separation, the resulting product was washed three times with 500 g of water, and the methyl isobutyl ketone was removed under reduced pressure to obtain 502 g of an aralkyl-modified phenolic compound (α-1). The aralkyl-modified phenolic compound (α-1) was a brown solid and had a hydroxyl equivalent of 269 g/eq.

Figure 2:
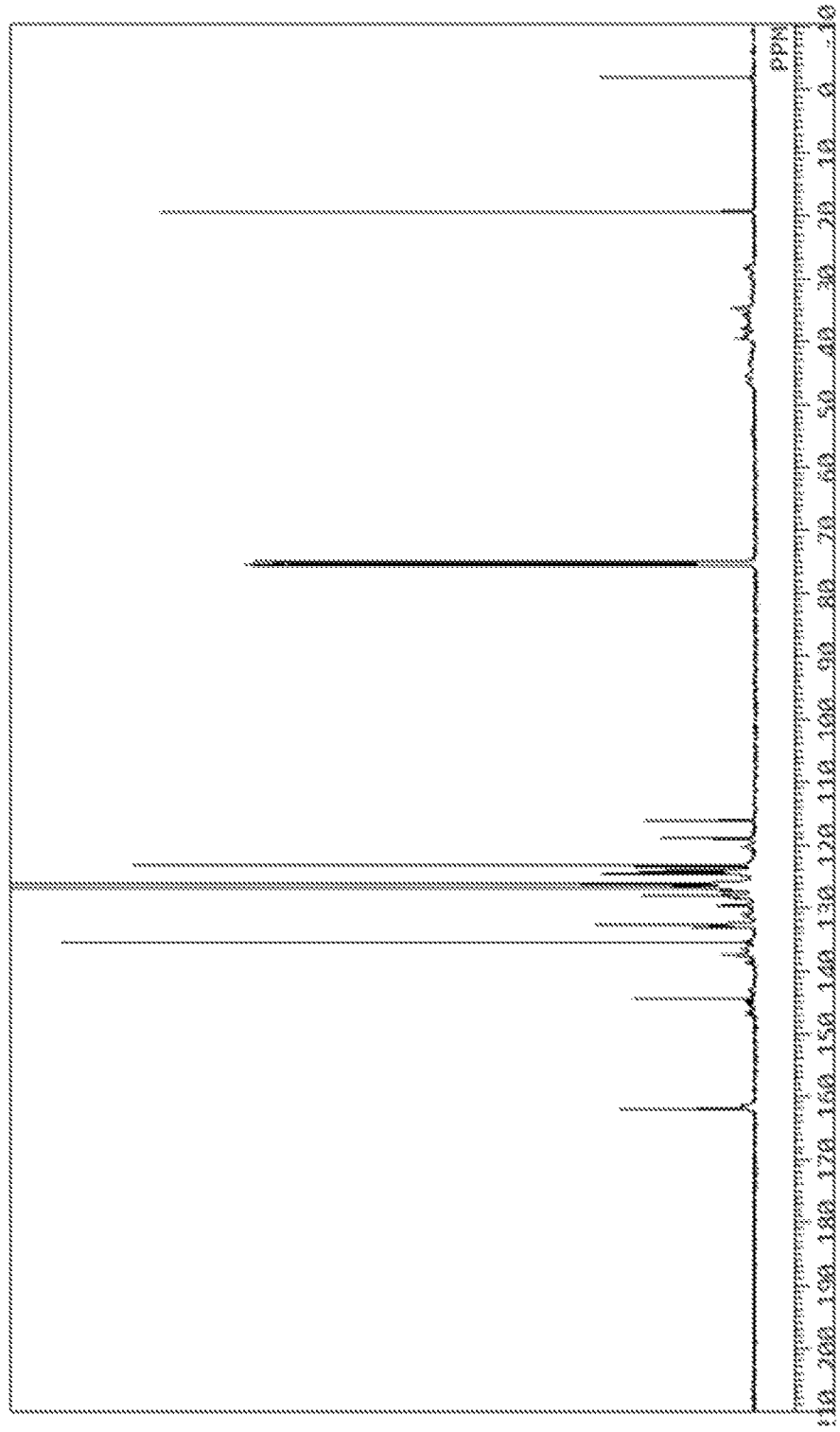
FIG. 2 is the $^{13}$C-NMR chart of the active ester resin (1) obtained in Example 1.
Figure 3:
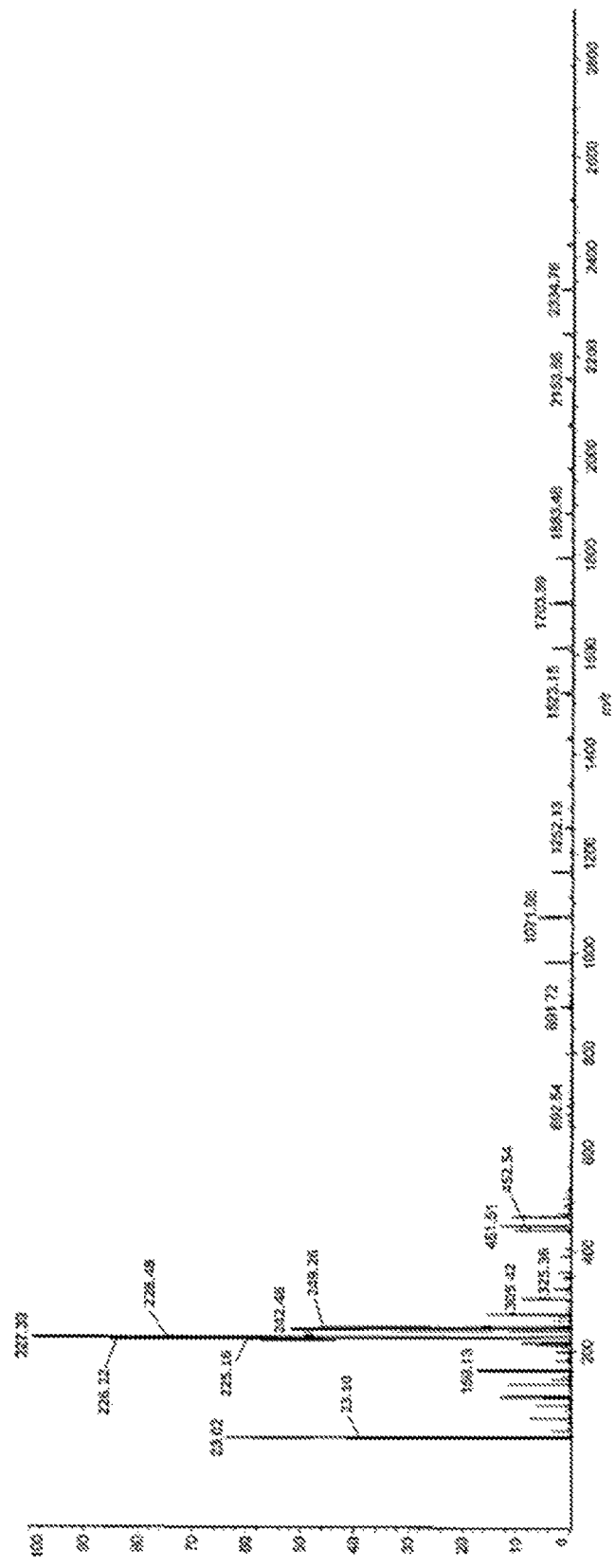
FIG. 3 is the MALDI-MS spectrum of the active ester resin (1) obtained in Example 1.

Into a flask equipped with a thermometer, a dropping funnel, a cooling pipe, a fractionating column, and a stirrer, 203.0 g of isophthalic acid chloride (number of moles of the acid chloride group: 2.0 mol) and 1338 g of toluene were put, and the content was dissolved under reduced pressure in a system purged with nitrogen. Then, 96.0 g (0.67 mol) of α-naphthol and 358 g (the number of moles of the phenolic hydroxyl group: 1.33 mol) of the aralkyl-modified phenolic compound (α-1) were added thereto, and the content was dissolved under reduced pressure in a system purged with nitrogen. Then, 400 g of a 20% sodium hydroxide aqueous solution was added dropwise thereto over 3 hours under purging with nitrogen gas while the temperature inside the system was controlled to be not more than 60° C. Stirring was subsequently continued for 1.0 hour under the same conditions. After the termination of the reaction, the product was left to stand in order to separate into phases, and the water layer was removed. Water was added to the toluene phase, in which the reaction product had been dissolved, and mixed therewith by stirring for approximately 15 minutes. The mixture was left to stand in order to separate into phases, and then the water layer was removed. This process was repeated until the pH of the water layer reached seven. Then, the moisture was removed by dehydration with a decanter to produce an active ester resin (1) which was in the form of a toluene solution having 65% of a nonvolatile content. The toluene solution having 65 mass % of the nonvolatile content had a solution viscosity of 3250 mPa·S (25° C.). The softening point thereof after drying was 140° C. FIG. 1 is the GPC chart of the active ester resin (1), FIG. 2 is the $^{13}$C-NMR chart thereof, and FIG. 3 illustrates an MALDI-MS spectrum thereof.

Example 2 Production of Active Ester Resin (2)

Into a flask equipped with a thermometer, a dropping funnel, a cooling pipe, a fractionating column, and a stirrer, 330 g (1.0 mol) of a dicyclopentadiene phenol resin, 108 g (1.0 mol) of benzyl alcohol, and 5 g of a p-toluenesulfonic acid monohydrate were put. The content was stirred at room temperature while nitrogen was blown. Then, the temperature was increased to 150° C., and stirring was carried out for 6 hours while generated water was distilled off to the outside of the system. After the termination of the reaction, 450 g of methyl isobutyl ketone and 5.8 g of a 20% sodium hydroxide aqueous solution were added thereto for neutralization, the water layer was subsequently removed by separation, the resulting product was washed three times with 450 g of water, and the methyl isobutyl ketone was removed under reduced pressure to obtain 413 g of an aralkyl-modified phenolic compound (α-2). The aralkyl-modified phenolic compound (α-2) was a brown solid and had a hydroxyl equivalent of 197 g/eq.

Into a flask equipped with a thermometer, a dropping funnel, a cooling pipe, a fractionating column, and a stirrer, 203.0 g of isophthalic acid chloride (number of moles of the acid chloride group: 2.0 mol) and 1338 g of toluene were put, and the content was dissolved under reduced pressure in a system purged with nitrogen. Then, 96.0 g (0.67 mol) of α-naphthol and 262 g (the number of moles of the phenolic hydroxyl group: 1.33 mol) of the aralkyl-modified phenolic compound (α-2) were added thereto, and the content was dissolved under reduced pressure in a system purged with nitrogen. Then, 400 g of a 20% sodium hydroxide aqueous solution was added dropwise thereto over 3 hours under purging with nitrogen gas while the temperature inside the system was controlled to be not more than 60° C. Stirring was continued for 1.0 hour under the same conditions. After the termination of the reaction, the product was left to stand in order to separate into phases, and the water layer was removed. Water was added to the toluene phase, in which the reaction product had been dissolved, and mixed therewith by stirring for approximately 15 minutes. The mixture was left to stand in order to separate into phases, and then the water layer was removed. This process was repeated until the pH of the water layer reached seven. Then, the moisture was removed by dehydration with a decanter to produce an active ester resin (2) which was in the form of a toluene solution having 65% of a nonvolatile content. The toluene solution having 65 mass % of the nonvolatile content had a solution viscosity of 3430 mPa·S (25° C.). The softening point thereof after drying was 140° C.

Example 3 Production of Active Ester Resin (3)

Into a flask equipped with a thermometer, a dropping funnel, a cooling pipe, a fractionating column, and a stirrer, 330 g (1.0 mol) of a dicyclopentadiene phenol resin, 21.6 g (0.2 mol) of benzyl alcohol, and 5 g of a p-toluenesulfonic acid monohydrate were put. The content was stirred at room temperature while nitrogen was blown. Then, the temperature was increased to 150° C., and stirring was carried out for 6 hours while generated water was distilled off to the outside of the system. After the termination of the reaction, 350 g of methyl isobutyl ketone and 5.8 g of a 20% sodium hydroxide aqueous solution were added thereto for neutralization, the water layer was removed by separation, the resulting product was washed three times with 350 g of water, and the methyl isobutyl ketone was removed under reduced pressure to obtain 341 g of an aralkyl-modified phenolic compound (α-3). The aralkyl-modified phenolic compound (α-3) was a brown solid and had a hydroxyl equivalent of 184 g/eq.

Into a flask equipped with a thermometer, a dropping funnel, a cooling pipe, a fractionating column, and a stirrer, 203.0 g of isophthalic acid chloride (number of moles of the acid chloride group: 2.0 mol) and 1338 g of toluene were put, and the content was dissolved under reduced pressure in a system purged with nitrogen. Then, 96.0 g (0.67 mol) of α-naphthol and 245 g (the number of moles of the phenolic hydroxyl group: 1.33 mol) of the aralkyl-modified phenolic compound (α-3) were added thereto, and the content was dissolved under reduced pressure in a system purged with nitrogen. Then, 400 g of a 20% sodium hydroxide aqueous solution was added dropwise thereto over 3 hours under purging with nitrogen gas while the temperature inside the system was controlled to be not more than 60° C. Stirring was continued for 1.0 hour under the same conditions. After the termination of the reaction, the product was left to stand in order to separate into phases, and the water layer was removed. Water was added to the toluene phase, in which the reaction product had been dissolved, and mixed therewith by stirring for approximately 15 minutes. The mixture was left to stand in order to separate into phases, and then the water layer was removed. This process was repeated until the pH of the water layer reached seven. Then, the moisture was removed by dehydration with a decanter to produce an active ester resin (3) which was in the form of a toluene solution having 65% of a nonvolatile content. The toluene solution having 65 mass % of the nonvolatile content had a solution viscosity of 3450 mPa·S (25° C.). The softening point thereof after drying was 144° C.

Example 4 Production of Active Ester Resin (4)

Into a flask equipped with a thermometer, a dropping funnel, a cooling pipe, a fractionating column, and a stirrer, 330 g (1.0 mol) of a dicyclopentadiene phenol resin, 353.3 g (2.0 mol) of chloromethyl naphthalene, 1000 g of toluene, and 60 g (1.5 mol) of sodium hydroxide were put. The content was stirred at 80° C. for 6 hours while nitrogen was blown. After the termination of the reaction, 60 g of sodium dihydrogen phosphate was added thereto for neutralization, the water layer was removed by separation, the resulting product was washed three times with 650 g of water, and the toluene was removed under reduced pressure to obtain 626 g of an aralkyl-modified phenolic compound (α-4). The aralkyl-modified phenolic compound (α-4) was a brown solid and had a hydroxyl equivalent of 321 g/eq.

Into a flask equipped with a thermometer, a dropping funnel, a cooling pipe, a fractionating column, and a stirrer, 203.0 g of isophthalic acid chloride (number of moles of the acid chloride group: 2.0 mol) and 1338 g of toluene were put, and the content was dissolved under reduced pressure in a system purged with nitrogen. Then, 96.0 g (0.67 mol) of α-naphthol and 427 g (the number of moles of the phenolic hydroxyl group: 1.33 mol) of the aralkyl-modified phenolic compound (α-4) were added thereto, and the content was dissolved under reduced pressure in a system purged with nitrogen. Then, 400 g of a 20% sodium hydroxide aqueous solution was added dropwise thereto over 3 hours under purging with nitrogen gas while the temperature inside the system was controlled to be not more than 60° C. Stirring was continued for 1.0 hour under the same conditions. After the termination of the reaction, the product was left to stand in order to separate into phases, and the water layer was removed. Water was added to the toluene phase, in which the reaction product had been dissolved, and mixed therewith by stirring for approximately 15 minutes. The mixture was left to stand in order to separate into phases, and then the water layer was removed. This process was repeated until the pH of the water layer reached seven. Then, the moisture was removed by dehydration with a decanter to produce an active ester resin (4) which was in the form of a toluene solution having 65% of a nonvolatile content. The toluene solution having 65 mass % of the nonvolatile content had a solution viscosity of 3850 mPa·S (25° C.). The softening point thereof after drying was 152° C.

Comparative Production Example 1

Into a flask equipped with a thermometer, a dropping funnel, a cooling pipe, a fractionating column, and a stirrer, 203.0 g (1.0 mol) of isophthalic acid chloride and 1254 g of dimethylformamide were put, and the content was dissolved under reduced pressure in a system purged with nitrogen. Then, 288.0 g (2.0 mol) of α-naphthol was added thereto, and the content was dissolved under reduced pressure in a system purged with nitrogen. Then, 400 g of a 20% sodium hydroxide aqueous solution was added dropwise thereto over 3 hours under purging with nitrogen gas while the temperature inside the system was controlled to be not more than 60° C. Stirring was continued for 1.0 hour under the same conditions. After the termination of the reaction, the product was left to stand in order to separate into phases, and the water layer was removed. Water was added to the toluene phase, in which the reaction product had been dissolved, and mixed therewith by stirring for approximately 15 minutes. The mixture was left to stand in order to separate into phases, and then the water layer was removed. This process was repeated until the pH of a water bath reached seven. Then, the moisture was removed by dehydration with a decanter to produce an active ester resin (1') which was a dimethylformamide solution having 65% of a nonvolatile content. The toluene solution having 65 mass % of the nonvolatile content had a solution viscosity of 860 mPa·S (25° C.)

Comparative Production Example 2

Into a flask equipped with a thermometer, a dropping funnel, a cooling pipe, a fractionating column, and a stirrer, 203.0 g (number of moles of the acid chloride group: 2.0 mol) of isophthalic acid chloride and 1800 g of toluene were put, and the content was dissolved under reduced pressure in a system purged with nitrogen. Then, 57.6 g (0.4 mol) of α-naphthol and 412.5 g (the number of moles of the phenolic hydroxyl group: 2.5 mol) of a dicyclopentadiene phenol resin were added thereto, and the content was dissolved under reduced pressure in a system purged with nitrogen. Then, 400 g of a 20% sodium hydroxide aqueous solution was added dropwise thereto over 3 hours under purging with nitrogen gas while the temperature inside the system was controlled to be not more than 60° C. Stirring was continued for 1.0 hour under the same conditions. After the termination of the reaction, the product was left to stand in order to separate into phases, and the water layer was removed. Water was added to the toluene phase, in which the reaction product had been dissolved, and mixed therewith by stirring for approximately 15 minutes. The mixture was left to stand in order to separate into phases, and then the water layer was removed. This process was repeated until the pH of a water bath reached seven. Then, the moisture was removed by dehydration with a decanter to produce an active ester resin (2') which was in the form of a toluene solution having 65 mass % of a nonvolatile content. The softening point of the active ester resin (2') after drying was 184° C.

<Evaluation of Solubility in Solvents>

Solutions of the active ester resins (1) to (3), (1'), and (2') produced in Examples 1 to 4 and Comparative Production Examples 1 and 2 in solvents were dried at 150° C. for 12 hours under vacuum, thereby obtaining dried solid resins. Each of the solid resins was dissolved in solvents of toluene, methyl ethyl ketone (hereinafter referred to as "MEK"), methyl isobutyl ketone (hereinafter referred to as "MIBK"), cyclohexanone, 1-methoxy-2-propanol (hereinafter referred to as "MP"), propylene glycol monomethyl ether acetate (hereinafter referred to as "PGMAC"), N-methylpyrrolidone (hereinafter referred to as "NMP"), n-butanol (hereinafter referred to as "BuOH"), and ethyl acetate at 25° C.; and the amounts (g) of the solid contents dissolved in 100 g of the solvents were evaluated. Table 1 shows the results of the evaluation.

TABLE 1

| | Active ester resin (1) | Active ester resin (2) | Active ester resin (3) | Active ester resin (4) | Active ester resin (1') | Active ester resin (2') |
|---|---|---|---|---|---|---|
| Toluene | >50 | >50 | >50 | >50 | <1 | >50 |
| MEK | >50 | >50 | >50 | >50 | 10 | >50 |

TABLE 1-continued

|  | Active ester resin (1) | Active ester resin (2) | Active ester resin (3) | Active ester resin (4) | Active ester resin (1') | Active ester resin (2') |
|---|---|---|---|---|---|---|
| MIBK | >50 | >50 | >50 | >50 | 15 | 30 |
| Cyclohexanone | >50 | >50 | >50 | >50 | 15 | >50 |
| MP | >50 | 40 | 20 | >50 | 10 | 10 |
| PGMAC | >50 | >50 | >50 | >50 | 10 | >50 |
| NMP | >50 | >50 | >50 | >50 | 20 | >50 |
| BuOH | >50 | >50 | 30 | >50 | 10 | 10 |
| Ethyl acetate | >50 | >50 | >50 | >50 | 20 | 30 |

Examples 4 to 7 and Comparative Examples 1 and 2

Preparation of Epoxy Resin Compositions and Evaluation of Physical Properties

The active ester resins (1) to (4), (1'), and (2') as curing agents were individually mixed with "EPICLON HP-7200H" manufactured by DIC Corporation (dicyclopentadiene phenol-type epoxy resin, melt viscosity of 0.30 poises at 150° C.) as an epoxy resin such that the epoxy groups which were present in the epoxy resin were equivalent to the ester bonds or total of the phenolic hydroxyl groups which were present in the curing agents. Then, 0.5 phr of dimethylaminopyridine as a curing catalyst was added thereto, and methyl ethyl ketone was further added thereto such that the nonvolatile content (N. V.) of each of the compositions was finally 58 mass %, thereby completing the preparation. Then, each of the resulting compositions was cured under the following conditions to produce a trial laminated plate, and the trial laminated plate was subjected to evaluations of dielectric properties and the coefficient of moisture absorption as described below. Table 2 shows results of the evaluations.

<Conditions for Producing Laminated Plate>
Substrate: Glass Cloth "#2116" (210×280 mm) manufactured by Nitto Boseki Co., Ltd.
Number of Plies: 6 Conditions for Forming Prepreg: 160° C.
Curing Conditions: 200° C., 40 kg/cm$^2$, and 1.5 hours
Plate Thickness after Shaping: 0.8 mm <Measurement of Dielectric Constant and Dielectric Dissipation Factor>

In accordance with JIS-C-6481, a test sample in the absolute dry state was stored in a room at a temperature of 23° C. and a humidity of 50% for 24 hours and then subjected to measurement of its dielectric constant and dielectric dissipation factor at 1 GHz with an impedance material analyzer "HP4291B" manufactured by Agilent Technologies.

<Measurement of Coefficient of Moisture Absorption>

A test sample was cut out in a size of 50×25×2 mm and stored in pressure cooker test equipment at 121° C., 2.1 atm, and 100% RH for 2 hours. Then, a change in the weight thereof between before and after the storage was analyzed.

TABLE 2

|  | Example 4 | Example 5 | Example 6 | Example 7 | Comparative Example 1 | Comparative Example 2 |
|---|---|---|---|---|---|---|
| Epoxy resin | HP-7200H (1 eq) | HP-7200H (1 eq) | HP-7200H (1 eq) | HP-7200H (1 eq) | HP-7200H (1 eq) | HP-7200H (1 eq) |
| Curing agent | Active ester resin (1) (1 eq) | Active ester resin (2) (1 eq) | Active ester resin (3) (1 eq) | Active ester resin (4) (1 eq) | Active ester resin (1') (1 eq) | Active ester resin (2') (1 eq) |
| Curing accelerator | Dimethyl-aminopyridine (5 phr) | Dimethyl-aminopyridine (5 phr) | Dimethyl-aminopyridine (5 phr) | Dimethyl-aminopyridine (5 phr) | Dimethyl-aminopyridine (5 phr) | Dimethyl-aminopyridine (5 phr) |
| Dielectric constant (1 GHz) | 3.7 | 3.7 | 3.8 | 3.5 | 3.7 | 3.9 |
| Dielectric dissipation factor (1 GHz) | 0.008 | 0.009 | 0.011 | 0.006 | 0.011 | 0.013 |
| Coefficient of moisture absorption (%) | 0.21 | 0.23 | 0.24 | 0.20 | 0.26 | 0.28 |

The invention claimed is:

1. An active ester resin represented by Structural Formula (1) comprising a structural moiety represented by Structural Formula (i)

(place Formula (i) and continue—GM)

where each R$^1$ independently represents a methyl group or a hydrogen atom; Ar$^1$ represents a phenylene group, a naphthylene group, or a phenylene group or naphthylene group which has one to three alkyl groups each having 1 to 4 carbon atoms on its aromatic nucleus; wherein the active ester resin has a molecular structure represented by Structural Formula (1)

(place Formula (1) and continue—GM)

where X represents a benzene ring or a naphthalene ring, k is 0 or 1, n is 1 or 2, l is 1 or 2, and m is the average of a repeating unit and from 0.25 to 1.5.

2. An epoxy resin composition comprising an epoxy resin and the active ester resin according to claim 1 as a curing agent.

3. A cured product comprising an epoxy resin and the active ester resin according to claim 1.

4. A prepreg comprising reinforcing substrate impregnated with the epoxy resin composition according to claim 2 which has been diluted with an organic solvent.

5. A circuit board comprising a plate of epoxy resin composition according to claim 2 diluted with an organic solvent and thermally molded together with copper foil under application of pressure.

6. A build-up film comprising the epoxy resin composition according to claim 2 diluted with an organic solvent, applied to a base film and dried.

\* \* \* \* \*